(12) United States Patent
Suzuki et al.

(10) Patent No.: US 8,035,395 B2
(45) Date of Patent: Oct. 11, 2011

(54) BATTERY LIFE PREDICTING DEVICE AND BATTERY LIFE PREDICTING METHOD

(75) Inventors: Tatsuhiko Suzuki, Osaka (JP); Hiroki Takeshima, Osaka (JP)

(73) Assignee: Panasonic Corporation, Osaka (JP)

( * ) Notice: Subject to any disclaimer, the term of this patent is extended or adjusted under 35 U.S.C. 154(b) by 660 days.

(21) Appl. No.: 12/280,608

(22) PCT Filed: Feb. 23, 2007

(86) PCT No.: PCT/JP2007/053362
§ 371 (c)(1),
(2), (4) Date: Aug. 25, 2008

(87) PCT Pub. No.: WO2007/105456
PCT Pub. Date: Sep. 20, 2007

(65) Prior Publication Data
US 2009/0037145 A1    Feb. 5, 2009

(30) Foreign Application Priority Data
Feb. 28, 2006  (JP) .................................. 2006-051720

(51) Int. Cl.
*G01N 27/416* (2006.01)
(52) U.S. Cl. .......................... 324/427; 324/432; 320/132
(58) Field of Classification Search .................. None
See application file for complete search history.

(56) References Cited

U.S. PATENT DOCUMENTS

| 5,675,258 | A | 10/1997 | Kadouchi et al. | |
|---|---|---|---|---|
| 7,208,914 | B2 * | 4/2007 | Klang | 320/132 |
| 7,554,330 | B2 * | 6/2009 | Ashtiani et al. | 324/426 |

(Continued)

FOREIGN PATENT DOCUMENTS

JP    2-22582    1/1990

(Continued)

OTHER PUBLICATIONS

Front page of Chinese Office Action issued in Chinese Patent Application No. 200780006803.6, mailed Mar. 9, 2011.

(Continued)

*Primary Examiner* — Edward Tso
*Assistant Examiner* — Ramy Ramadan
(74) *Attorney, Agent, or Firm* — McDermott Will & Emery LLP

(57) ABSTRACT

A battery life predicting device and a battery life predicting method capable of accurately predict the lifetime of storage batteries are provided. The expected lifetime value selecting unit 7 selects, as an expected lifetime value, a lifetime value that corresponds to the load power applied by the storage battery during discharge and the ambient temperature of the location where the storage battery 3 is installed while referring to the lifetime data stored in the lifetime data storing unit 5, the first diminution in lifetime calculating unit 12a calculates the first diminution in lifetime based on a natural logarithm function that takes the time obtained by converting the number of discharge cycles of the storage battery 3 as a variable, the second diminution in lifetime calculating unit 12b calculates the second diminution in lifetime from the mean value of the storage battery temperatures during charging, discharging or an idle state, the ambient temperature and the time elapsed after the installation of the storage battery 3, and the remaining lifetime value calculating unit 12c calculates the remaining lifetime value by subtracting the first diminution in lifetime and the second diminution in lifetime from the expected lifetime value.

10 Claims, 7 Drawing Sheets

U.S. PATENT DOCUMENTS

| | | | |
|---|---|---|---|
| 7,619,417 B2 * | 11/2009 | Klang | 324/427 |
| 2005/0017687 A1 | 1/2005 | Nagaoka | |
| 2008/0125987 A1 | 5/2008 | Suzuki et al. | |

FOREIGN PATENT DOCUMENTS

| | | |
|---|---|---|
| JP | 2-32276 | 2/1990 |
| JP | 5-315015 | 11/1993 |
| JP | 8-138759 | 5/1996 |
| JP | 2000-215923 | 8/2000 |
| JP | 2000-243459 | 9/2000 |
| WO | WO 2006/013881 A1 | 2/2006 |

OTHER PUBLICATIONS

European Office Action issued in European Patent Application No. EP 07 714 833.6-1524 dated Nov. 9, 2010.

* cited by examiner

BATTERY LIFE PREDICTING DEVICE AND BATTERY LIFE PREDICTING METHOD

This application is the U.S. National Phase under 35 U.S.C. §371 of International Application No. PCT/JP2007/053362, filed on Feb. 23, 2007, which in turn claims the benefit of Japanese Application No. 2006-051720, filed on Feb. 28, 2006, the disclosures of which Applications are incorporated by reference herein.

TECHNICAL FIELD

The present invention relates to a battery life predicting device and a battery life predicting method for evaluating the lifetime of a storage battery used in an uninterruptible power supply or the like, and more particularly to a battery life predicting device and a battery life predicting method that predict the lifetime with high accuracy based on the intrinsic behavior of a nickel-hydrogen storage battery.

BACKGROUND ART

It is important to predict the lifetime of a storage battery for the maintenance of an apparatus that incorporates a backup storage battery such as an uninterruptible power supply (UPS). While corrosion of the hydrogen-absorbing alloy used to form the negative electrode is a major cause of deterioration in the lifetime of a nickel-hydrogen storage battery, other factors may also contribute to the deterioration such as the operating temperature, the number of discharge cycles, the elapsed time and the load power applied during discharge. The variety of factors that affect the lifetime make it difficult to precisely predict the lifetime of a storage battery in use.

It has been proposed to use an increase in internal resistance in the latter stage of life and/or change in voltage during discharge as the parameter for estimating the capacity and lifetime of a nickel-hydrogen storage battery. For example, an apparatus disclosed in Japanese Unexamined Patent Publication No. 8-138759 estimates the deterioration from the distribution of discharge voltages corresponding to a plurality of discharge currents and calculating the gradient thereof. An apparatus disclosed in Japanese Unexamined Patent Publication No. 2000-215923 estimates the deterioration by comparing the internal resistance and battery voltage measured during discharging with the initial values thereof. These lifetime predicting methods are based on the correlation between the internal resistance of the storage battery and the resultant change in voltage and the lifetime of the storage battery, and are useful due to the ability to predict the lifetime in a short period of time.

Meanwhile such a method has been proposed that predicts the lifetime of a storage battery from a remaining lifetime value that is the difference between an expected lifetime value computed from the power applied to the load during discharge and a diminution in lifetime calculated as a linear function of the number of discharge cycles (refer to, for example, Japanese Unexamined Patent Publication No. 2000-243459). This method enables prediction of the lifetime while correcting a highly accurate expected lifetime value without the need to forcibly discharge the storage battery, and is therefore useful for lead-acid storage batteries.

However, the methods disclosed in Japanese Unexamined Patent Publication (Kokai) No. 8-138759 and Japanese Unexamined Patent Publication (Kokai) No. 2000-215923, cannot predict the lifetime unless the internal resistance increases to some extent and, moreover, do not take into account such factors as rate of discharge and battery temperature that contribute to the diminution of lifetime. The method disclosed in Japanese Unexamined Patent Publication (Kokai) No. 2000-243459 has such a problem that, since the equation used to estimate the lifetime is not a linear equation of the number of discharge cycles because the nickel-hydrogen storage battery has an intrinsic deterioration behavior (corrosion of hydrogen-absorbing alloy used in the negative electrode), the estimate of the remaining lifetime value deviates significantly from the actual value.

DISCLOSURE OF THE INVENTION

The present invention has been made to solve the problems described above, and an object of the invention is to provide a battery life predicting device and a battery life predicting method capable of accurately predicting the lifetime of storage batteries.

A battery life predicting device according to one aspect of the present invention comprises a lifetime data storing unit for storing lifetime data that shows the relationship between the load power applied by a storage battery during discharge, the ambient temperature of the location where the storage battery is installed and the lifetime of the storage battery; a load power measuring unit for measuring the load power applied by the storage battery; an ambient temperature measuring unit for measuring the ambient temperature; an expected lifetime selecting unit for selecting, as an expected lifetime value, a lifetime that corresponds to the load power measured by the load power measuring unit and the ambient temperature measured by the ambient temperature measuring unit while referring to the lifetime data stored in the lifetime data storing unit; a discharge cycles counting unit for counting the number of discharge cycles of the storage battery; a first diminution in lifetime calculating unit for calculating a first diminution in lifetime which decreases the expected lifetime value based on a natural logarithmic function that takes a value of time, obtained by converting the number of discharge cycles counted by the discharge cycles counting unit, as a variable; a mean value calculating unit that calculates the mean value of the storage battery temperatures during charging, discharging or an idle state; an elapsed time measuring unit for measuring the time elapsed after the installation of the storage battery; a second diminution in lifetime calculating unit for calculating a second diminution in lifetime which decreases the expected lifetime value based on the mean value of the storage battery temperatures calculated by the mean value calculating unit, the ambient temperature measured by the ambient temperature measuring unit and the time elapsed measured by the elapsed time measuring unit; and a remaining lifetime value calculating unit for calculating the remaining lifetime value by subtracting the first diminution in lifetime calculated by the first diminution in lifetime calculating unit and the second diminution in lifetime calculated by the second diminution in lifetime calculating unit from the expected lifetime value selected by the expected lifetime selecting unit.

A battery life predicting method according to another aspect of the present invention comprises a load power measuring step for measuring the load power applied by a storage battery during discharge; an ambient temperature measuring step for measuring the ambient temperature of the location where the storage battery is installed; an expected lifetime value selecting step for selecting the expected lifetime value by finding a value of lifetime that corresponds to the load power measured in the load power measuring step and the ambient temperature measured in the ambient temperature measuring step while referring to the lifetime data that shows the relationship between the load power applied by the storage battery during discharging and the ambient temperature of the storage battery, and the lifetime; a number of discharges counting step for counting the number of discharge cycles of the storage battery; a first diminution in lifetime calculating step for calculating the first diminution in lifetime which decreases the expected lifetime value based on a natural logarithmic function that takes a value of time, obtained by converting the number of discharge cycles counted in the discharge cycles counting step, as a variable; a mean value counting step for calculating the mean value of the storage battery temperatures during charging, discharging or an idle state; an elapsed time measuring step for measuring the time elapsed after the installation of the storage battery; a second diminution in lifetime calculating step for calculating the second diminution in lifetime which decreases the expected lifetime value based on the mean value of the storage battery temperatures calculated in the mean value counting step, the ambient temperature measured in the ambient temperature measuring step and the time elapsed measured in the elapsed time measuring step; and a remaining lifetime value calculating step for calculating the remaining lifetime value by subtracting the first diminution in lifetime calculated in the first diminution in lifetime calculating step and the second diminution in lifetime calculated in the second diminution in lifetime calculating step from the expected lifetime value selected in the expected lifetime value selecting step.

In these constitutions, lifetime data, that shows the relationship between the load power applied by the storage battery during discharge and the ambient temperature of the location where the storage battery is installed, and the lifetime of the storage battery, is stored in the lifetime data storing unit. With the load power applied during discharge and the ambient temperature being measured, reference is made to the lifetime data stored in the lifetime data storing unit so that a lifetime that corresponds to the measured values of the load during discharge and the ambient temperature is selected as the expected lifetime value. With the number of discharge cycles of the storage battery being counted, the first diminution in lifetime which decreases the expected lifetime value is calculated based on a natural logarithmic function that takes a value of time, obtained by converting the number of discharge cycles, as a variable. Then the mean value of the storage battery temperatures during charging, discharging or an idle state is calculated. With the time elapsed after the installation of the storage battery being measured, the second diminution in lifetime which decreases the expected lifetime value is calculated based on the mean value of the storage battery temperatures, the ambient temperature measured and the time elapsed. Then the remaining lifetime value is calculated by subtracting the first diminution in lifetime and the second diminution in lifetime from the expected lifetime value.

Accordingly, since the expected lifetime value is determined as a value that corresponds to the load power and the ambient temperature, while the first diminution in lifetime calculated based on a natural logarithmic function that takes a value of time, obtained by converting the number of discharge cycles, as a variable, and the second diminution in lifetime calculated from the mean value of the storage battery temperatures, the ambient temperature and the time elapsed are subtracted from the expected lifetime value, it is made possible to accurately predict the lifetime of the storage battery while taking into account the influences on the lifetime of the storage battery by the discharge made for backup during power failure, and factors that are not directly related to the number of discharge cycles such as the ambient temperature and the time elapsed after the installation of the storage battery.

Objects, features, aspects and advantages of the present invention become more apparent from the following detailed description and accompanying drawings.

BEST MODE FOR CARRYING OUT THE INVENTION

The battery life predicting device according to this embodiment will now be described with reference to the accompanying drawings. The present invention can be implemented with modification made within the scope of the invention.

First Embodiment

Figure 1:
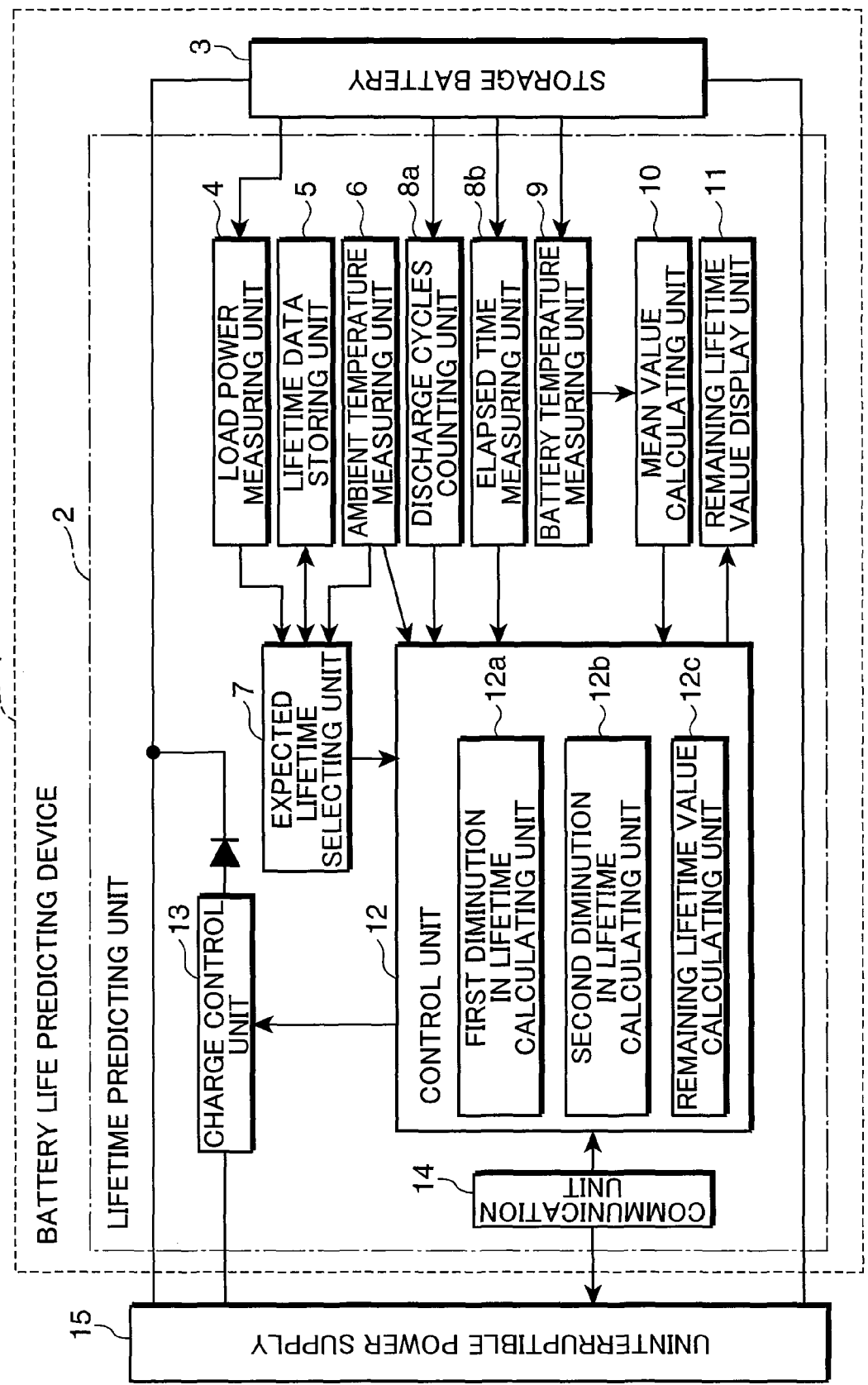
FIG. 1 is a block diagram showing the constitution of a battery life predicting device according to a first embodiment.

FIG. 1 is a block diagram showing the constitution of the battery life predicting device according to the first embodiment. A battery life predicting device 1 shown in FIG. 1 comprises a lifetime predicting unit 2 and a storage battery 3 incorporated in an uninterruptible power supply. The storage battery 3 is constituted specifically from a nickel-hydrogen storage battery.

The lifetime predicting unit 2 comprises a load power measuring unit 4, a lifetime data storing unit 5, an ambient temperature measuring unit 6, an expected lifetime selecting unit 7, a discharge cycles counting unit 8a, an elapsed time measuring unit 8b, a battery temperature measuring unit 9, a mean value calculating unit 10, a remaining lifetime value display unit 11, a control unit 12, a charge control unit 13 and a communication unit 14.

The load power measuring unit 4 measures the load power. The lifetime data storing unit 5 stores lifetime data, that is determined in advance to show the relation between the load power and the lifetime of the storage battery for ambient temperatures selected at predetermined intervals, in the form of load power vs. battery temperature table. The ambient temperature measuring unit 6 measures the ambient temperature of the location where the storage battery 3 is installed. The expected lifetime selecting unit 7 selects the expected lifetime value from the lifetime data stored in the lifetime data storing unit 5 based on the load power measured by the load power measuring unit 4 and the ambient temperature measured by the ambient temperature measuring unit 6.

The discharge cycles counting unit 8a counts the number of discharge cycles of the storage battery 3. The elapsed time measuring unit 8b measures the time elapsed after the installation of the storage battery 3. The battery temperature measuring unit 9 measures the temperature of the storage battery 3 at predetermined time intervals. The mean value calculating unit 10 calculates the mean value by dividing the sum of the battery temperatures measured by the battery temperature measuring unit 9 by the number of measurements.

The control unit 12 comprises a first diminution in lifetime calculating unit 12a, a second diminution in lifetime calculating unit 12b and a remaining lifetime value calculating unit 12c. The first diminution in lifetime calculating unit 12a estimates the diminution in lifetime by converting the number of discharge cycles counted by the discharge cycles counting unit 8a into time. The second diminution in lifetime calculating unit 12b estimates the diminution in lifetime from the mean value of the storage battery temperatures calculated by the mean value calculating unit 10 and the time elapsed measured by the elapsed time measuring unit 8b. The remaining lifetime value calculating unit 12c calculates the remaining lifetime value by subtracting the first diminution in lifetime calculated by the first diminution in lifetime calculating unit 12a and the second diminution in lifetime calculated by the second diminution in lifetime calculating unit 12b from the expected lifetime value selected by the expected lifetime selecting unit 7.

Specifically, denoting the expected lifetime value as $L_0$, the number of discharge cycles as N, the first diminution in lifetime as $L_1$, the time elapsed after installation of the storage battery as D, the mean value of the storage battery temperatures during charging, discharging or an idle state measured at predetermined time intervals as $T_m$, the ambient temperature at the time when the expected lifetime value is calculated as $T_0$, the second diminution in lifetime as $L_2$ and the remaining lifetime value as L, the first diminution in lifetime $L_1$ is given by equation (1), the second diminution in lifetime $L_2$ is given by equation (2) and the remaining lifetime value L is given by equation (3) as shown below.

$$L_1 = a \times \ln(b \times N) + c \quad (1)$$

$$L_2 = d \times D \times 2^{[T_m - T_0/10]} \quad (2)$$

$$L = L_0 - (L_1 + L_2) \quad (3)$$

In the equations, a, b, c and d are constants, and ln represents a natural logarithmic function.

The first diminution in lifetime $L_1$ increases with the progress of corrosion of the hydrogen-absorbing alloy used to form the negative electrode. As such, the first diminution in lifetime $L_1$ decreases when the constitution of the battery is changed so as to suppress corrosion from proceeding or make the battery life less susceptible to corrosion. While the values of constants a and b change depending on the structure of the nickel-hydrogen storage battery, such as separator thickness, the value of constant c remains substantially constant in the nickel-hydrogen storage battery. Constant b has a dimension that converts the number of discharge cycles N into time. The first diminution in lifetime calculating unit 12a calculates the first diminution in lifetime $L_1$ by a logarithmic function that takes the time obtained by converting the number of discharge cycles N counted by the discharge cycles counting unit 8a as a variable.

The mean value calculating unit 10 calculates the mean value $T_m$ of the storage battery temperatures during charging, discharging or an idle state measured at predetermined time intervals, and the second diminution in lifetime calculating unit 12b calculates the second diminution in lifetime $L_2$ by multiplying the value of an exponential function that takes the difference between the mean value $T_m$ of the storage battery temperatures and the measured value of ambient temperature $T_0$ as a variable by the time D elapsed after the installation of the storage battery. The remaining lifetime value calculating unit 12c calculates the remaining lifetime value L by subtracting the first diminution in lifetime $L_1$ and the second diminution in lifetime $L_2$ from the expected lifetime value $L_0$, thereby determining the lifetime. The lifetime of a nickel-hydrogen storage battery decreases exponentially as the temperature of the battery increases. This is because corrosion of the hydrogen-absorbing alloy proceeds faster at high temperatures than at a normal temperature. The lifetime of a nickel-hydrogen storage battery can be accurately estimated by adding this factor to the first diminution in lifetime $L_1$.

The second diminution in lifetime $L_2$ varies in accordance to the mean value $T_m$ of the storage battery temperatures. Therefore, the second diminution in lifetime $L_2$ is decreased when the constitution of the battery is changed so as to suppress heat generation or improve the heat dissipation. Constant d remains substantially constant with the same type of storage battery.

The charge control unit 13 controls charging of the storage battery 3 based on the remaining lifetime value calculated by the remaining lifetime value calculating unit 12c. The communication unit 14 communicates with an uninterruptible power supply 15. The communication unit 14 sends the remaining lifetime value calculated by the remaining lifetime value calculating unit 12c to the uninterruptible power supply 15. The remaining lifetime value display unit 11 displays the remaining lifetime value calculated by the remaining lifetime value calculating unit 12c.

The storage battery 3 is provided integrally with various sections of the battery life predicting device 1. As the storage battery 3 is provided integrally with various sections of the battery life predicting device 1, it becomes easier to handle and the length of wiring becomes shorter between the storage battery 3 and the counting unit and the measuring unit of the battery life predicting device 1.

While the storage battery 3 is provided integrally with various sections of the battery life predicting device 1 in this embodiment, the present invention is not limited to this constitution and such a constitution as the storage battery 3 is replaceably (detachably) provided may also be employed. Specifically, the battery life predicting device 1 may further have a sensing unit that senses that the storage battery 3 has been replaced and a resetting unit that resets the number of discharge cycles and the time elapsed, in the case the sensing unit senses that the storage battery 3 has been replaced. In this case, since it is sensed that a new storage battery 3 is inserted and the number of discharge cycles and the time elapsed are reset, the storage battery can be replaced even if the remaining lifetime value of the storage battery has reached a predetermined level and it is determined that the end of lifetime has reached, thus allowing determination of the lifetime of the new storage battery.

Figure 2:
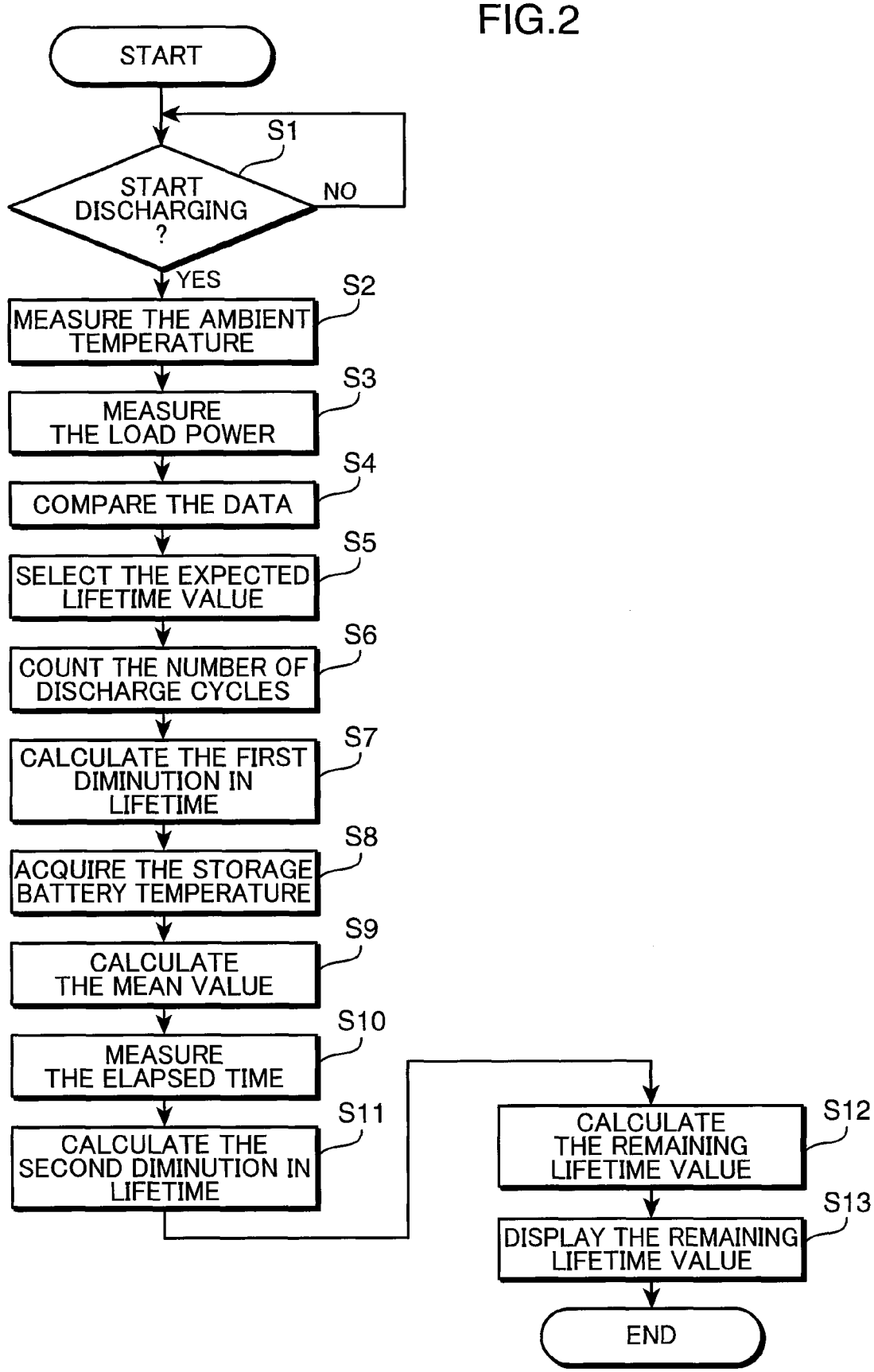
FIG. 2 is a flow chart explanatory of the operation of the battery life predicting device according to the first embodiment.

The battery life predicting method that employs the battery life predicting device shown in FIG. 1 will now be described by making reference to a flow chart. FIG. 2 is a flow chart explanatory of the operation of the battery life predicting device according to the first embodiment.

As the nickel-hydrogen storage battery 3 incorporated in the uninterruptible power supply starts discharging, the battery life predicting device 1 starts operation and carries out the operations to determine the expected lifetime value $L_0$ (steps S2 to S5), the operations to determine the first diminution in lifetime $L_1$ (steps S6 and S7), and the operations to determine the second diminution in lifetime $L_2$ (steps S8 to S11). While the operations to determine the expected lifetime value $L_0$, the operations to determine the first diminution in lifetime $L_1$ and the operations to determine the second diminution in lifetime $L_2$ are carried out sequentially in this embodiment, the present invention is not limited to this procedure and the order of carrying out the operations may be changed or the operations may be carried out concurrently.

The control unit 12 first determines whether the nickel-hydrogen storage battery 3 incorporated in the uninterruptible power supply has started to discharge or not (step S1). If it is determined that the nickel-hydrogen storage battery 3 has not started to discharge (NO in step S1), the control enters a standby state until the nickel-hydrogen storage battery 3 starts to discharge.

If it is determined that the nickel-hydrogen storage battery has started to discharge (YES in step S1), the ambient temperature measuring unit 6 measures the ambient temperature $T_0$ of the location where the storage battery 3 is installed (step S2). The load power measuring unit 4 measures the power applied to the load during discharge (step S3). The load power is normally given in terms of hour rate of the discharge current showing the discharge rate.

Then the expected lifetime selecting unit 7 compares the value of load power measured by the load power measuring unit 4 with a value most proximate to the ambient temperature measured by the ambient temperature measuring unit 6 in the load power vs. battery life table (step S4). The relationship between the load power and the lifetime of the storage battery is determined in advance for the ambient temperatures selected at predetermined intervals, and the data representing this relationship is stored in the lifetime data storing unit 5 as the load power vs. battery temperature table. Alternatively stated, the lifetime data storing unit 5 stores the load power vs. battery temperature table for various ambient temperatures. Then the expected lifetime selecting unit 7 selects the expected lifetime value $L_0$ that matches the load power in the load power vs. battery temperature table, and sends it to the control unit 12 (step S5).

The discharge cycles counting unit 8a counts the number of discharge cycles N of the storage battery 3, and sends it to the control unit 12 (step S6). Then the first diminution in lifetime calculating unit 12a calculates the first diminution in lifetime $L_1$ by a natural logarithmic function that takes the time obtained by converting the number of discharge cycles N by the equation (1) as a variable (step S7).

Then the mean value calculating unit 10 acquires the temperatures of the storage battery 3 (storage battery temperatures) measured at predetermined time intervals from the battery temperature measuring unit 9 (step S8). The battery temperature measuring unit 9 measures the temperatures of the storage battery 3 at constant time intervals.

Then the mean value calculating unit 10 calculates the mean value $T_m$ based on the storage battery temperatures measured by the battery temperature measuring unit 9 and the number of measurements (step S9). The elapsed time measuring unit 8b measures the time D elapsed after the installation of the storage battery 3 (step S10).

Then the second diminution in lifetime calculating unit 12b calculates the second diminution in lifetime $L_2$ by substituting the time elapsed D measured by the elapsed time measuring unit 8b, mean value $T_m$ of the storage battery temperatures calculated by the mean value calculating unit 10 and the ambient temperature $T_0$ measured by the ambient temperature measuring unit 6 into the equation (2) (step S11).

The remaining lifetime value calculating unit 12c calculates the remaining lifetime value L by the equation (3). Specifically, the remaining lifetime value calculating unit 12c calculates the remaining lifetime value L by subtracting the first diminution in lifetime $L_1$ calculated by the first diminution in lifetime calculating unit 12a and the second diminution in lifetime $L_2$ calculated by the second diminution in lifetime calculating unit 12b from the expected lifetime value $L_0$ selected by the expected lifetime selecting unit 7 (step S12).

The remaining lifetime value L calculated as described above is sent from the control unit 12 to the remaining lifetime value display unit 11. The remaining lifetime value display unit 11 is constituted from a liquid crystal display or the like, and displays the remaining lifetime value L calculated by the remaining lifetime value calculating unit 12c on a screen thereof. While the user is informed of the remaining lifetime value by the display of the remaining lifetime value in this embodiment, the present invention is not limited to this method and the lifetime may also be notified to the user by lighting of an LED or by a sound.

In the case the remaining lifetime value is notified to the user by means of an LED, for example, the control unit 12 controls the LED to light up with a color that corresponds to the remaining lifetime value, or checks the remaining lifetime value to see whether it has reached a predetermined limit and, if it has been reached, turns on the LED. For example, the control unit 12 turns on the LED when the remaining lifetime value decreases to zero. In the case the remaining lifetime value is notified to the user by means of a sound, for example, the control unit 12 controls a speaker to make a sound that corresponds to the remaining lifetime value calculated by the remaining lifetime value calculating unit 12c, or checks the remaining lifetime value to see whether it has reached a predetermined limit and, if it has been reached, controls the speaker to make a predetermined sound. For example, the control unit 12 controls the speaker to make a predetermined sound when the remaining lifetime value decreases to zero.

The remaining lifetime value L is also sent to the uninterruptible power supply 15 via the communication unit 14. The uninterruptible power supply 15 receives the remaining lifetime value L sent via the communication unit 14. The uninterruptible power supply 15 has a remaining lifetime value display unit that displays the remaining lifetime value L that has been received. In this embodiment, the battery life predicting device 1 has the remaining lifetime value display unit 11. However, such a constitution may also be employed where the battery life predicting device 1 does not have the remaining lifetime value display unit 11 and the uninterruptible power supply 15 has the remaining lifetime value display unit 11. In this case, the remaining lifetime value display unit of the uninterruptible power supply 15 displays the remaining lifetime value L sent via the communication unit 14.

The charge control unit 13 controls charging of the nickel-hydrogen storage battery 3 that has discharged based on the remaining lifetime value L. For example, the charge control unit 13 controls in such a manner that the nickel-hydrogen storage battery is not charged when the remaining lifetime value L is below a predetermined level.

Since the nickel-hydrogen storage battery is often installed at a location not readily visible to the user, it is preferable to install the remaining lifetime value display unit 11 at a location that is readily visible to the user such as the control unit of the uninterruptible power supply.

Second Embodiment

The battery life predicting device according to the second embodiment will now be described. The battery life predicting method according to the second embodiment is capable of predicting the lifetime of the nickel-hydrogen storage battery more accurately. According to the battery life predicting method of the second embodiment, an occasional expected lifetime value is calculated by multiplying the value of an exponential function that takes the difference between the measured value of ambient temperatures and the mean value of temperatures of the storage battery as a variable by the initial value of the expected lifetime value, and calculating the remaining lifetime value by subtracting the first diminution in lifetime and the second diminution in lifetime from the occasional expected lifetime value.

Strictly speaking, the expected lifetime value $L_0$ (same as the initial expected lifetime value) in the battery life predicting method of the first embodiment changes exponentially with the battery temperature. Adding this factor in the battery life predicting method of the first embodiment makes it possible to predict the lifetime of the nickel-hydrogen storage battery more accurately.

Figure 3:
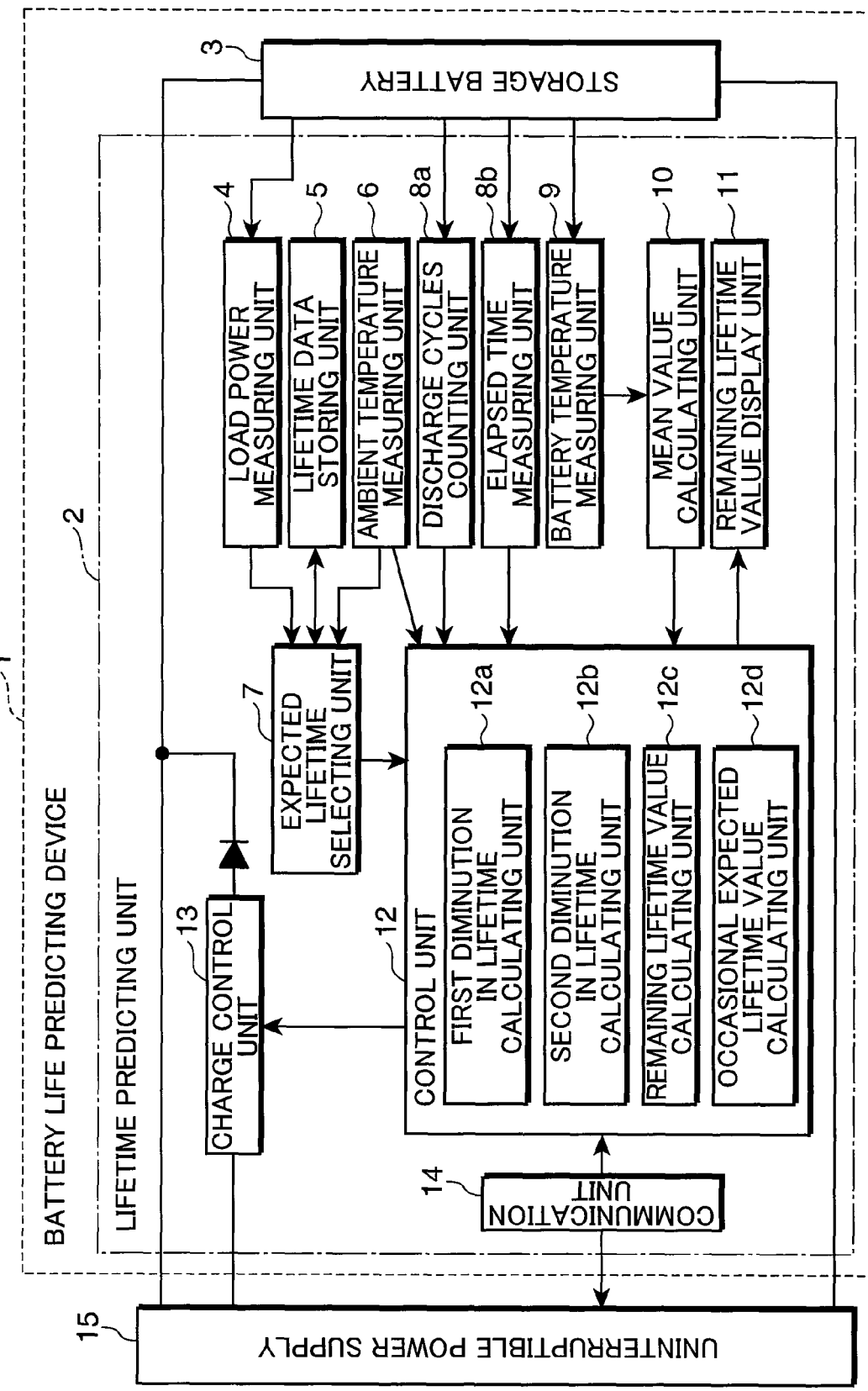
FIG. 3 is a block diagram showing the constitution of a battery life predicting device according to a second embodiment.

FIG. 3 is a block diagram showing the constitution of the battery life predicting device according to the second embodiment. In FIG. 3, components identical to those of the first embodiment will be denoted with the same reference numerals and a description thereof will be omitted.

The lifetime predicting unit 2 shown in FIG. 3 comprises the load power measuring unit 4, the lifetime data storing unit 5, the ambient temperature measuring unit 6, the expected lifetime selecting unit 7, the discharge cycles counting unit 8a, the elapsed time measuring unit 8b, the battery temperature measuring unit 9, the mean value calculating unit 10, the remaining lifetime value display unit 11, the control unit 12, the charge control unit 13 and the communication unit 14.

The control unit 12 comprises the first diminution in lifetime calculating unit 12a, the second diminution in lifetime calculating unit 12b, the remaining lifetime value calculating unit 12c and an occasional expected lifetime value calculating unit 12d. The occasional expected lifetime value calculating unit 12d calculates the occasional expected lifetime value based on the expected lifetime value that is read from the lifetime data storing unit 5 plus the information received from the mean value calculating unit 10. Specifically, the occasional expected lifetime value calculating unit 12d calculates the occasional expected lifetime value by multiplying the value of an exponential function that takes the difference between the ambient temperature measured by the ambient temperature measuring unit 6 and the mean value of temperatures of the storage battery calculated by the mean value calculating unit 10 as a variable by the value of the expected lifetime value selected by the expected lifetime selecting unit 7.

The remaining lifetime value calculating unit 12c calculates the remaining lifetime value by subtracting the first diminution in lifetime calculated by the first diminution in lifetime calculating unit 12a and the second diminution in lifetime calculated by the second diminution in lifetime calculating unit 12b from the occasional expected lifetime value calculated by the occasional expected lifetime value calculating unit 12d.

Specifically, denoting the expected lifetime value as $L_0$, the occasional expected lifetime value as $L_m$, the first diminution in lifetime as $L_1$, the ambient temperature at the time when the expected lifetime value $L_0$ is calculated as $T_0$, the mean value of the storage battery temperatures during charging, discharging or an idle state as $T_m$, the second diminution in lifetime as $L_2$ and the remaining lifetime value as L, the occasional expected lifetime value $L_m$ is given by equation (4), and the remaining lifetime value L is given by equation (5) as shown below.

$$L_m = L_0 \times 2^{[T_0 T_m/10]} \quad (4)$$

$$L = L_m - (L_1 + L_2) \quad (5)$$

Figure 4:
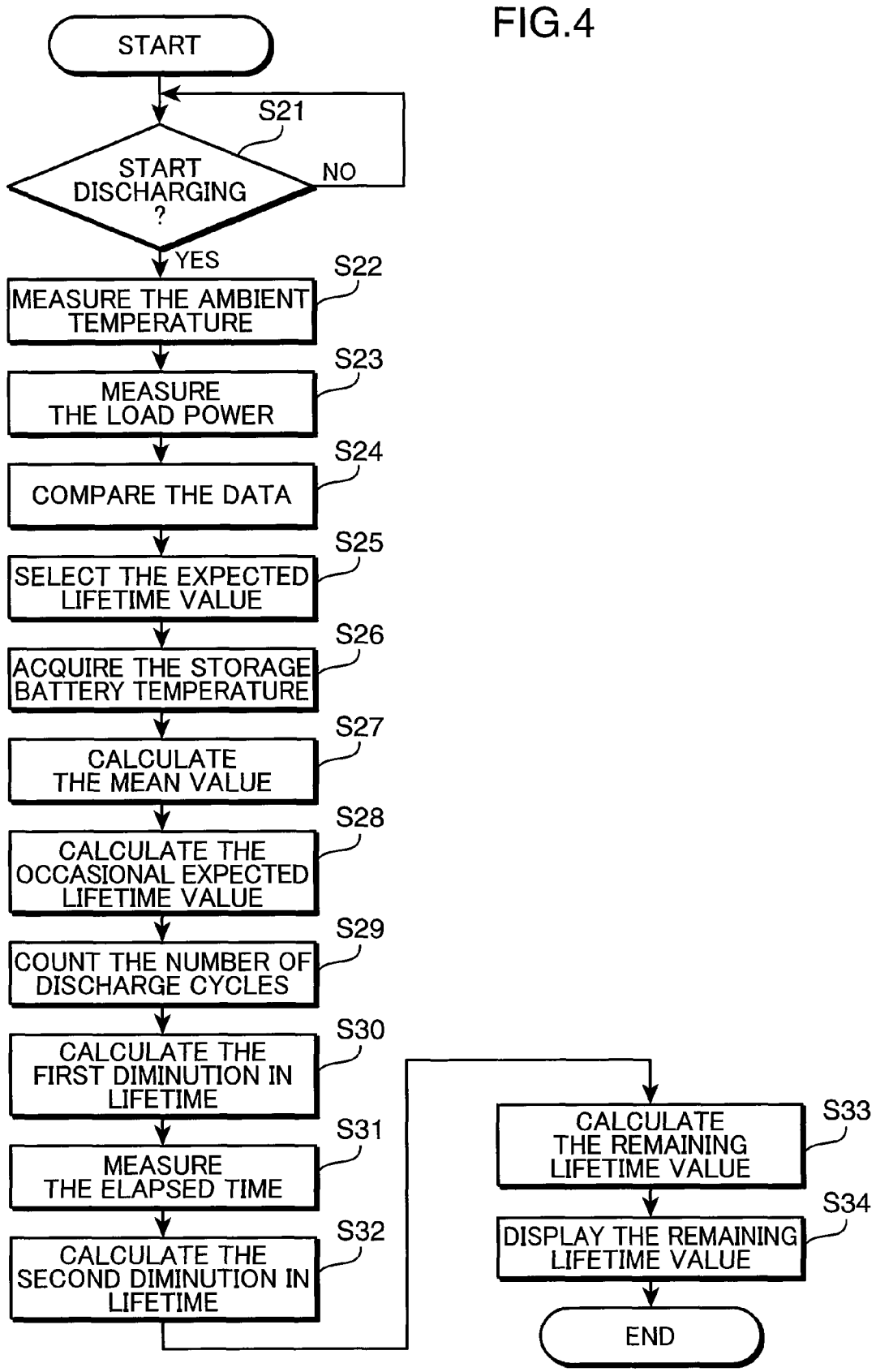
FIG. 4 is a flow chart explanatory of the operation of the battery life predicting device according to the second embodiment.

The battery life predicting method that uses the battery life predicting device shown in FIG. 3 will now be described with reference to a flow chart. FIG. 4 is a flow chart explanatory of the operation of the battery life predicting device according to the second embodiment.

Description will be omitted for steps S21 to S25 shown in FIG. 4, which are the same as steps S1 to S5 shown in FIG. 2. The battery life predicting method of the second embodiment is the same as the battery life predicting method of the first embodiment in the processes up to step S5 where the initial value of the expected lifetime value $L_0$ is determined, but is different thereafter.

The mean value calculating unit 10 acquires the data of the storage battery 3 temperature (the storage battery temperature) measured at predetermined time intervals from the battery temperature measuring unit 9 (step S26). The battery temperature measuring unit 9 measures the temperature of the storage battery 3 at equal time intervals. Then the mean value calculating unit 10 calculates the mean value $T_m$ based on the storage battery temperatures measured by the battery temperature measuring unit 9 and the number of measurements (step S27).

Then the occasional expected lifetime value calculating unit 12d calculates the occasional expected lifetime value $L_m$ by substituting the ambient temperature $T_0$ measured by the ambient temperature measuring unit 6 and the mean value $T_m$ of the storage battery temperatures calculated by the mean value calculating unit 10 into the equation (4) (step S28).

Description will be omitted for steps S29 to S32 shown in FIG. 4, which are the same as steps S6, S7, S10 and S11 shown in FIG. 2.

Then the remaining lifetime value calculating unit 12c calculates the remaining lifetime value L by subtracting the first diminution in lifetime $L_1$ and the second diminution in lifetime $L_2$ from the occasional expected lifetime value $L_m$, calculated by the occasional expected lifetime value calculating unit 12d, so as to predict the lifetime of the nickel-hydrogen storage battery 3 (step S33). The process of step S34 is the same as that of step S13 shown in FIG. 2.

According to the battery life predicting method of the second embodiment, when calculating the lifetime from the load power applied by the nickel-hydrogen storage battery 3 during discharge, by preparing the lifetime data that represents the relationship between the load power and the ambient temperature, and the lifetime, and selecting as the expected lifetime value a lifetime that corresponds to the measured values of load power and the ambient temperature, accurate prediction of the lifetime is possible. Furthermore, in the case the storage battery 3 is discharging as the backup power supply in the event of power failure, the lifetime of the storage battery 3 that would be deteriorated by the discharge is compensated, so as to predict the lifetime of the nickel-hydrogen storage battery accurately.

Third Embodiment

The battery life predicting device of the third embodiment will now be described. The battery life predicting method of the third embodiment can more accurately predict the lifetime of the nickel-hydrogen storage battery. According to the battery life predicting method of the third embodiment, the remaining lifetime value is calculated by subtracting the first diminution in lifetime and the second diminution in lifetime from the expected lifetime value, and the remaining lifetime value is stored. The remaining lifetime value is updated every time the subtraction of the first diminution in lifetime and the second diminution in lifetime is carried out, thereby estimating the lifetime.

In the battery life predicting method of the first embodiment, accuracy of predicting the remaining lifetime value becomes higher when the operations of calculating the first diminution in lifetime and second diminution in lifetime and subtracting the second diminution in lifetime from the remaining lifetime value are carried out at shorter intervals. Adding this factor in the battery life predicting method of the first embodiment makes it possible to predict the lifetime of the nickel-hydrogen storage battery more accurately.

Figure 5:
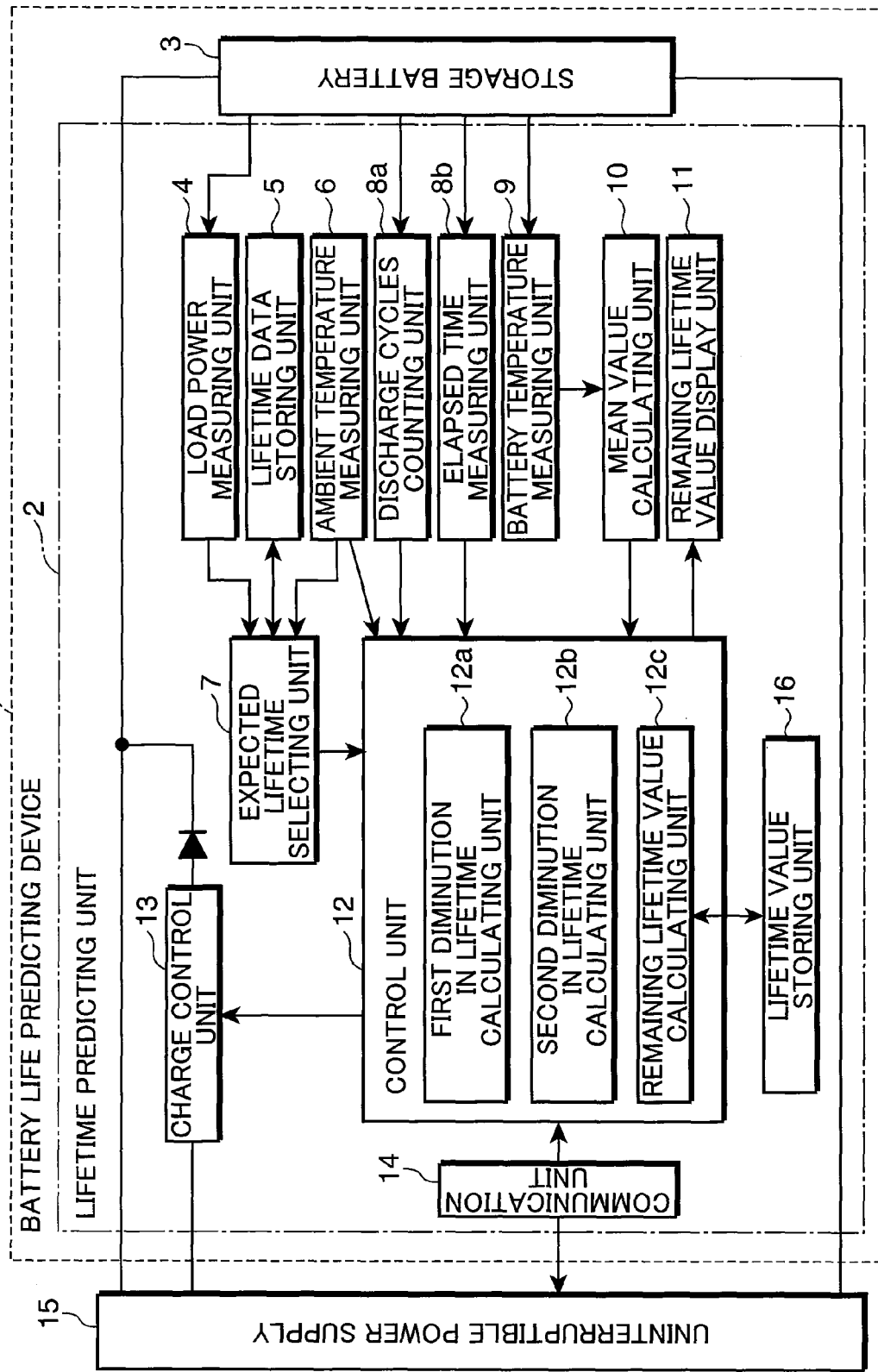
FIG. 5 is a block diagram showing the constitution of a battery life predicting device according to a third embodiment.

FIG. 5 is a block diagram showing the constitution of the battery life predicting device according to the third embodiment. In FIG. 5, components identical with those of the first embodiment will be denoted with the same reference numerals and a description thereof will be omitted.

The lifetime predicting unit 2 shown in FIG. 5 comprises the load power measuring unit 4, the lifetime data storing unit 5, the ambient temperature measuring unit 6, the expected lifetime selecting unit 7, the discharge cycles counting unit 8a, the elapsed time measuring unit 8b, the battery temperature measuring unit 9, the mean value calculating unit 10, the remaining lifetime value display unit 11, the control unit 12, the charge control unit 13, the communication unit 14 and a lifetime value storing unit 16. The control unit 12 comprises the first diminution in lifetime calculating unit 12a, the second diminution in lifetime calculating unit 12b and the remaining lifetime value calculating unit 12c.

The lifetime value storing unit 16 stores the remaining lifetime value calculated by the remaining lifetime value calculating unit 12c. The remaining lifetime value calculating unit 12c reads the last value of the remaining lifetime value that has been calculated and stored in the lifetime value storing unit 16, and calculates the latest value of the remaining lifetime value by subtracting the first diminution in lifetime and the second diminution in lifetime from the remaining lifetime value that has been read. The remaining lifetime value calculating unit 12c then stores the latest value of the remaining lifetime value in the lifetime value storing unit 16, thereby updating the lifetime value storing unit 16.

Specifically, denoting the initial value of the expected lifetime value as $L_0$, the first diminution in lifetime as $L_1$, the ambient temperature at the time when the initial value of the expected lifetime value $L_0$ is calculated as $T_0$, the mean value of the storage battery temperatures during charging, discharging or an idle state as $T_m$, the second diminution in lifetime as $L_2$, the latest value of remaining lifetime value as $L_x$, the last value of remaining lifetime value as $L_{x-1}$, the interval of subtracting the second diminution in lifetime $L_2$ from the remaining lifetime value as $D_x$, the second diminution in lifetime $L_2$ is given by equation (6), and the remaining lifetime value $L_x$ is given by equation (7) as shown below.

$$L_2 = d \times D_x \times 2^{[T_m - T_0/10]} \quad (6)$$

$$L_x = L_{x-1} - (L_1 + L_2) \{X \geq 1\} \quad (7)$$

Figure 6:
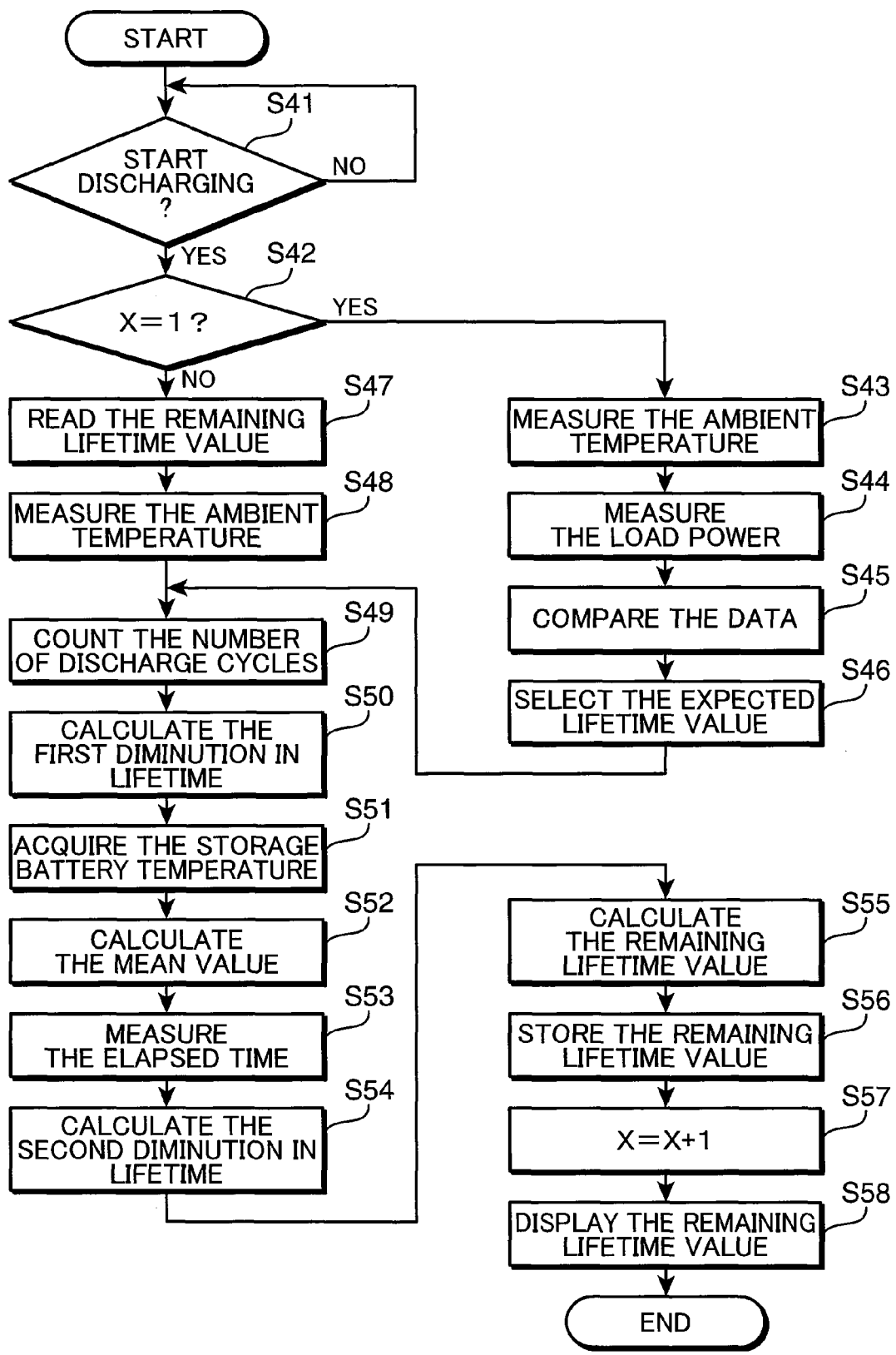
FIG. 6 is a flow chart explanatory of the operation of the battery life predicting device according to the third embodiment.

The battery life predicting method that uses the battery life predicting device shown in FIG. 5 will now be described with reference to a flow chart. FIG. 6 is a flow chart explanatory of the operation of the battery life predicting device according to the third embodiment.

Description will be omitted for step S41 shown in FIG. 6, which is the same as step S1 shown in FIG. 2. In step S42, the control unit determines whether the number of calculations X of the remaining lifetime value is 1 or not. The control unit 12 stores the number of calculations X of the remaining lifetime value. When it is determined that the number of calculations X is 1, in other words, that the remaining lifetime value is calculated for the first time (YES in step S42), the control proceeds to the process of step S43. Description will be omitted for steps S43 to S46, which are the same as steps S2 to S5 shown in FIG. 2.

When it is determined that the number of calculations X is not 1 (NO in step S42), the remaining lifetime value calculating unit 12c reads the last value of the remaining lifetime value stored in the lifetime value storing unit 16 (step S47). Then the ambient temperature measuring unit 6 measures the ambient temperature $T_0$ of the location where the storage battery 3 is installed (step S48). Description will be omitted for steps S49 to S52, which are the same as steps S6 to S9 shown in FIG. 2. When the number of calculations X of the remaining lifetime value is 1, the elapsed time measuring unit 8b measures the time $D_x$ elapsed since the storage battery 3 was installed. When the number of calculations X of the remaining lifetime value is not 1, the elapsed time measuring unit 8b measures the time $D_x$ elapsed since the last value of remaining lifetime value was calculated (step S53). The elapsed time measuring unit 8b stores the time when the last value of the remaining lifetime value was calculated, and calculates the time $D_x$ elapsed since the last value of the remaining lifetime value was calculated using this time as the basis.

Then the second diminution in lifetime calculating unit 12b calculates the second diminution in lifetime $L_2$ by substituting the time $D_x$ measured by the elapsed time measuring unit 8b, the mean value $T_m$ of the storage battery temperatures calculated by the mean value calculating unit 10 and the ambient temperature $T_0$ measured by the ambient temperature measuring unit 6 into the equation (6) (step S54).

Then the remaining lifetime value calculating unit 12c calculates the latest value of the remaining lifetime value $L_x$ by the equation (7). When the number of calculations X of the remaining lifetime value is 1, then the remaining lifetime value calculating unit 12c calculates the remaining lifetime value L by subtracting the first diminution in lifetime $L_1$ calculated by the first diminution in lifetime calculating unit 12a and the second diminution in lifetime $L_2$ calculated by the second diminution in lifetime calculating unit 12b from the expected lifetime value $L_0$ selected by the expected lifetime selecting unit 7. When the number of calculations X of the remaining lifetime value is not 1, then the remaining lifetime value calculating unit 12c calculates the latest value of the remaining lifetime value $L_x$ by subtracting the first diminution in lifetime $L_1$ calculated by the first diminution in lifetime calculating unit 12a and the second diminution in lifetime $L_2$ calculated by the second diminution in lifetime calculating unit 12b from the last value of the remaining lifetime value $L_{x-1}$ that has been read from the lifetime value storing unit 16 (step S55).

The remaining lifetime value calculating unit 12c stores the latest value of the remaining lifetime value $L_x$ that has been calculated in the lifetime value storing unit 16, thereby updating the data stored in the lifetime value storing unit 16 (step S56). Then the control unit 12 increments the number of calculations X of the remaining lifetime value (step S57). The process of S58 is the same as the process of step S13 shown in FIG. 2.

According to the battery life predicting method of the third embodiment, when calculating the lifetime from the load power applied by the nickel-hydrogen storage battery 3 during discharge, by preparing the lifetime data that shows the relationship between the load power and the ambient temperature to the lifetime, and selecting as the expected lifetime value, a lifetime that corresponds to the measured values of load power and the ambient temperature, accurate prediction of the lifetime is possible. Furthermore, in case the storage battery is discharging as the backup power supply in the event of power failure, lifetime of the storage battery that would be deteriorated by the discharge is compensated, so as to predict the lifetime of the nickel-hydrogen storage battery accurately.

Examples of calculating the remaining lifetime value by the equations described above under various conditions according to the battery life predicting method of the embodiments will now be described.

EXAMPLE 1

In Example 1, a group of electrodes was formed by combining positive electrodes made by filling a 3-dimensional porous body of nickel with spherical powder of nickel hydroxide and negative electrodes made by coating nickel-plated punching metal with hydrogen-absorbing alloy powder in a theoretical capacity ratio of 1/2 (capacity of the negative electrodes is twice that of the positive electrodes), and winding the electrodes via a separator made of an unwoven fabric of polypropylene sulfonate. The group of electrodes was put into a cylindrical can made of steel and plated with nickel, that was filled with an electrolyte consisting of an aqueous solution of KOH and NaOH and was sealed at the opening thereof by means of a sealing plate and a gasket. Thus a cylindrical nickel-hydrogen storage battery A measuring 17 mm in diameter, 50 mm in height and 0.18 mm in thickness of the separator with a nominal capacity of 1,800 mAh was made.

The storage battery A was incorporated in the battery life predicting device shown in FIG. 1. After fully subjecting the nickel-hydrogen storage battery to an initial activation cycle, the below charge and discharge test was conducted at an ambient temperature of 40° C. The expected lifetime value (initial expected lifetime value) $L_0$ was calculated by comparing the ambient temperature and the lifetime data of the storage battery that had been derived from the discharge current.

Charging: 900 mA, charging stopped when the voltage is decreased by 5 mV from the peak attained voltage (so-called $-\Delta V$ control system).

Idle State: 69 hours

After the charging operation and the idle state, the storage battery was discharged with discharge current of 1,800 mA till the voltage decreased to 1.0V. After repeating the discharge for 300 days, 900 days and 1,500 days, the remaining lifetime value L was calculated by referring to the flow chart of FIG. 2. It was determined that the battery life predicting device reached the lifetime at the time when remaining capacity of the nickel-hydrogen storage battery decreased to 1080 mAh (60% of the nominal capacity).

The expected lifetime value $L_0$, the ambient temperature at the time when the expected lifetime value was measured, the discharge rate (shown hour rate) and the values of constants a, b, c and d of the equations (1) and (2) used in predicting the lifetime are shown in row No. 1 of Table 1, and the results of calculating the remaining lifetime value L are shown in row No. 1 of Table 2.

EXAMPLE 2

In Example 2, the remaining lifetime value L was calculated according to the flow chart of FIG. 2, by using the battery life predicting device and the storage battery A of Example 1 and changing the discharge rate to a hour rate ×5 and a hour rate ×0.5. The expected lifetime value $L_0$, conditions of calculation and the values of constants a, b, c and d are shown in rows No. 2 and No. 3 of Table 2, and the results of calculating the remaining lifetime value L are shown in No. 2 and No. 3 of Table 2. Row No. 2 of Table 2 shows the expected lifetime value $L_0$ when the hour rate is multiplied by 5 and row No. 3 of Table 2 shows the expected lifetime value $L_0$ when the hour rate is multiplied by 0.5.

COMPARATIVE EXAMPLE 1

Comparative Example 1 provides a comparison to Examples 1 to 3. In Comparative Example 1, the remaining lifetime value L was calculated by using the battery life predicting device of Example 1 and the storage battery A and using the linear function $L=L_0-eN$ instead of the equations (1) to (3) under the same conditions as those of Examples 1 and 2. The constant e represents the factors of the structure of the nickel-hydrogen storage battery such as the separator thickness, and has the dimension that converts the number of discharge cycles N to time. The expected lifetime value $L_0$, conditions of calculation and the value of constant e are shown in rows No. 9 to No. 11 of Table 1, and the result of calculating the remaining lifetime value L is shown in rows No. 9 to No. 11 of Table 2. Row No. 9 of Table 1 shows the expected lifetime value $L_0$ when the hour rate is multiplied by 1, Row No. 10 of Table 1 shows the expected lifetime value $L_0$ when the hour rate is multiplied by 5 and row No. 11 of Table 1 shows the expected lifetime value $L_0$ when the hour rate is multiplied by 0.5.

EXAMPLE 3

In Example 3, the remaining lifetime value L was calculated
according to the flow chart of FIG. 4, by using the battery life predicting device and the storage battery A of Example 1. The battery life predicting device uses the equations (4) and (5) when calculating the remaining lifetime value L. The expected lifetime value $L_0$, conditions of calculation and the values of constants a, b, c and d are shown in row No. 4 of Table 1, and the results of calculating the remaining lifetime value L are shown in row No. 4 of Table 2. The mean value T, of the storage battery temperatures is shown in Table 2.

EXAMPLE 4

In Example 4, the remaining lifetime value L was calculated by using the battery life predicting device and the storage battery A of Example 1 under the same conditions as those of Example 1 except for changing the ambient temperature to 35° C. The expected lifetime value $L_0$, conditions of calculation and the values of constants a, b, c and d are shown in row No. 5 of Table 1, and the results of calculating the remaining lifetime value L are shown in row No. 5 of Table 2. Row No. 5 of Table 1 shows the expected lifetime value $L_0$ when the ambient temperature is set to 35° C.

COMPARATIVE EXAMPLE 2

Comparative Example 2 provides a comparison to Example 4. In Comparative Example 2, the remaining lifetime value L was calculated by using the battery life predicting device and the storage battery A of Example 1 and using the linear function $L=L_0-eN$ under the same conditions as those of Example 4. The constant e is the same as that of Comparative Example 1. The expected lifetime value $L_0$, conditions of calculation and the value of constant e are shown in row No. 12 of Table 1, and the results of calculating the remaining lifetime value L are shown in row No. 12 of Table 2. Row No. 12 of Table 1 shows the expected lifetime value $L_0$ when the ambient temperature is set to 35° C.

EXAMPLE 5

In Example 5, a cylindrical nickel-hydrogen storage battery B having a structure similar to that of Example 1 except that the separator was 0.18 mm in thickness and the nominal capacity was 1,600 mAh, and a cylindrical nickel-hydrogen storage battery C having a structure similar to that of Example 1 except that the separator was 0.26 mm in thickness and the nominal capacity was 1,400 mAh were made. The remaining lifetime values L of the storage batteries B and C were calculated under the same conditions as those of Example 1. The expected lifetime value $L_0$, conditions of calculation and the values of constants a, b, c and d are shown in rows No. 6 and No. 7 of Table 1, and the results of calculating the remaining lifetime value L are shown in rows No. 6 and No. 7 of Table 2. Row No. 6 of Table 1 shows the expected lifetime value $L_0$ when the storage battery B was used, and row No. 7 of Table 1 shows the expected lifetime value $L_0$ when the storage battery C was used.

COMPARATIVE EXAMPLE 3

Comparative Example 3 provides a comparison to Example 5. In Comparative Example 3, the remaining lifetime value L was calculated by using the battery life predicting device and the storage batteries B and C of Example 5 and using the linear function $L=L_0-eN$ under the same conditions as those of Example 5. The constant e, similar to Comparative Example 1, has the dimension that converts the number of discharge cycles N to time. The expected lifetime value $L_0$, conditions of calculation and the value of constant e are shown in rows No. 13 and No. 14 of Table 1, and the results of calculating the remaining lifetime value L are shown in rows No. 13 and No. 14 of Table 2. Row No. 13 of Table 1 shows the expected lifetime value $L_0$ when the storage battery B was used, and row No. 14 of Table 1 shows the expected lifetime value $L_0$ when the storage battery C was used.

REFERENCE EXAMPLE

In the Reference Example, the first diminution in lifetime $L_1$ was calculated by using the equation (8) instead of the equation (1) used in calculating the first diminution in lifetime $L_1$ in Example 1. Constant f in the equation (8) has the same meaning as constant b, but does not have the dimension that converts the number of discharge cycles N to time. In the Reference Example, the second diminution in lifetime was calculated by the equation (9) instead of the equation (2) used in calculating second diminution in lifetime $L_2$ in Example 1. In the equation (9), g is a constant. In other words, the remaining lifetime value L was calculated with the dimension of number of discharge cycles. Then the lifetime was predicted with the dimension of time by setting the duration of single charging and discharging cycle to 72 hours (3 days). The expected lifetime value $L_0$, conditions of calculation and the values of constants a, c, f and g are shown in row No. 8 of Table 1, and the results of calculating the remaining lifetime value L are shown in row No. 8 of Table 2.

$$L_1 = a \times \ln(f \times N) + c \quad (8)$$

$$L_2 = g \times N \times 2^{[T_m - T_0)/10]} \quad (9)$$

EXAMPLE 6

In Example 6, the remaining lifetime value L ($L_x$) was calculated according to the flow chart of FIG. 6, by using the battery life predicting device and the storage battery A of Example 1. The battery life predicting device used the equation (6) to calculate the second diminution in lifetime $L_2$, and used the equation (7) to calculate the remaining lifetime value L ($L_x$). The expected lifetime value $L_0$, conditions of calculation and the values of constants a, b, c and d are shown in row No. 15 of Table 1, and the results of calculating the remaining lifetime value L ($L_x$) are shown in row No. 15 of Table 2.

Figure 7:
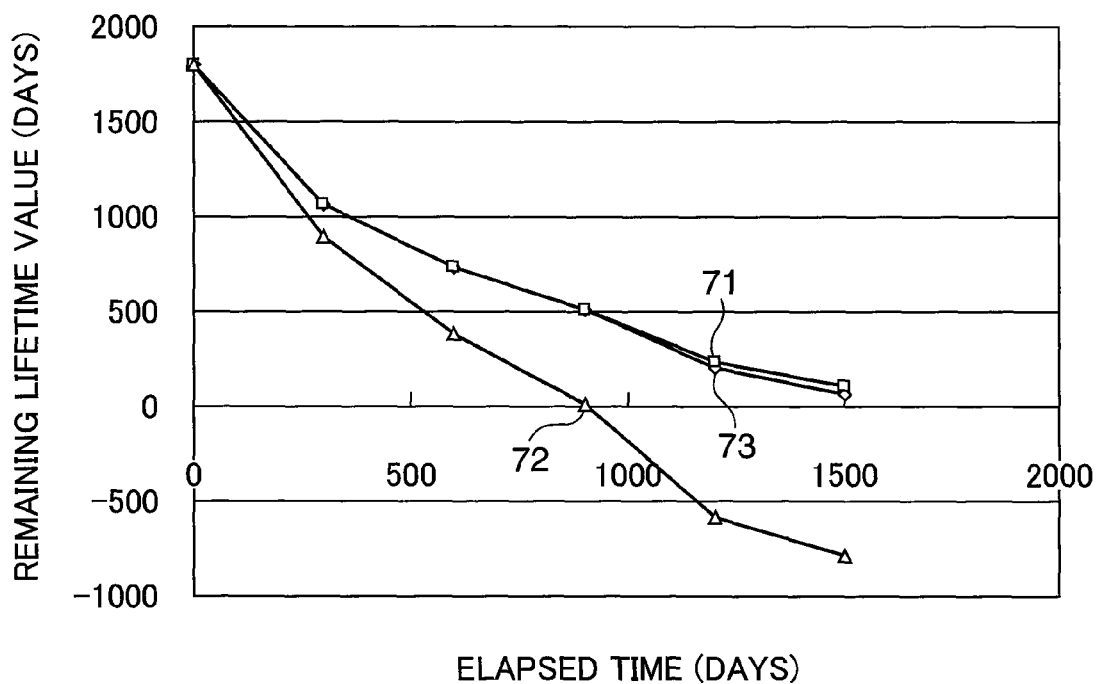
FIG. 7 is a diagram showing the change in the remaining lifetime value with time in Example 6, Example 1 and the Reference Example.

In Example 6, the second diminution in lifetime $L_2$ was calculated at intervals of 300 days and was subtracted from the remaining lifetime value. Calculated values of the second diminution in lifetime $L_2$ are shown in Table 3. Table 3 shows the mean value $T_m$ of the storage battery temperatures and the second diminution in lifetime $L_2$ calculated at intervals of 300 days. FIG. 7 is a diagram showing the change in the remaining lifetime value with elapsed time in Example 6, Example 1 and the Reference Example. In FIG. 7, data points represented by squares 71 show the change in remaining lifetime value calculated in Example 1. Data points represented by triangles 72 show the change in remaining lifetime value calculated in the Reference Example. Data points represented by diamonds 73 show the change in the remaining lifetime value calculated in Example 6.

Table 2 shows the deviation between the values of the remaining lifetime values L determined in Examples 1 to 6, Comparative Examples to 3 and the Reference Example, and the measured values at different elapsed times. The number of days of deviation is given by subtracting the measured value from the sum of remaining lifetime value L and the days elapsed. For example, in No. 1, the remaining lifetime value L at the time when 300 days have elapsed is 1061 days and the measured value is 1,530 days. Therefore, the number of days of deviation is given by subtracting the measured value from the sum of the remaining lifetime value L and 300 days, and the result is −169 days.

TABLE 1

| No. | Battery | Ambient temperature (° C.) | Hour rate (X) | $L_0$ (Days) | Equation | a | b | c | d | e | f | g |
|---|---|---|---|---|---|---|---|---|---|---|---|---|
| 1 | A | 40 | 1 | 1,800 | Equation 1, 2, 3 | 315 | 0.037 | 225 | 0.34 | — | — | — |
| 2 | A | 40 | 5 | 2,160 | Equation 1, 2, 3 | 315 | 0.037 | 225 | 0.34 | — | — | — |
| 3 | A | 40 | 0.5 | 1,200 | Equation 1, 2, 3 | 315 | 0.037 | 225 | 0.34 | — | — | — |
| 4 | A | 40 | 1 | 1,800 | Equation 4, 5 | 315 | 0.037 | 225 | 0.34 | — | — | — |
| 5 | A | 35 | 1 | 2,550 | Equation 1, 2, 3 | 315 | 0.037 | 225 | 0.34 | — | — | — |
| 6 | B | 40 | 1 | 2,190 | Equation 1, 2, 3 | 309 | 0.035 | 225 | 0.34 | — | — | — |
| 7 | C | 40 | 1 | 2,700 | Equation 1, 2, 3 | 306 | 0.034 | 225 | 0.34 | — | — | — |
| 8 | A | 40 | 1 | 1,800 | Equation 3, 8, 9 | 315 | — | 225 | — | — | 0.037 | 2.7 |

TABLE 1-continued

| No. | Battery | Ambient temperature (° C.) | Hour rate (X) | $L_0$ (Days) | Equation | a | b | c | d | e | f | g |
|---|---|---|---|---|---|---|---|---|---|---|---|---|
| 9 | A | 40 | 1 | 1,800 | $L_0$-eN | — | — | — | — | 6.45 | — | — |
| 10 | A | 40 | 5 | 2,160 | $L_0$-eN | — | — | — | — | 6.45 | — | — |
| 11 | A | 40 | 0.5 | 1,200 | $L_0$-eN | — | — | — | — | 6.45 | — | — |
| 12 | A | 35 | 1 | 2,550 | $L_0$-eN | — | — | — | — | 6.45 | — | — |
| 13 | B | 40 | 1 | 2,190 | $L_0$-eN | — | — | — | — | 6.15 | — | — |
| 14 | C | 40 | 1 | 2,700 | $L_0$-eN | — | — | — | — | 6.00 | — | — |
| 15 | A | 40 | 1 | 1,800 | Equation 1, 6, 7 | 315 | 0.037 | 225 | 0.34 | — | — | — |

TABLE 2

| | After 300 days | | | | | | After 900 days | | | | | |
|---|---|---|---|---|---|---|---|---|---|---|---|---|
| No. | $L_1$ (days) | $T_m$ (° C.) | $L_2$ (days) | $L_m$ (days) | L (days) | Deviation (days) | $L_1$ (days) | $T_m$ (° C.) | $L_2$ (days) | $L_m$ (days) | L (days) | Deviation (days) |
| 1 | 637 | 40 | 102 | — | 1,061 | −169 | 983 | 40 | 306 | — | 511 | −119 |
| 2 | 637 | 40 | 102 | — | 1,421 | −158 | 983 | 40 | 306 | — | 871 | −108 |
| 3 | 637 | 40 | 102 | — | 461 | −259 | 983 | 40 | 306 | — | −89 | −209 |
| 4 | 637 | 40 | 102 | 1800 | 1,061 | −169 | 983 | 40 | 306 | 1800 | 511 | −119 |
| 5 | 637 | 35 | 102 | — | 1,811 | −159 | 983 | 35 | 306 | — | 1,261 | −109 |
| 6 | 612 | 40 | 102 | — | 1,476 | −195 | 952 | 40 | 306 | — | 932 | −139 |
| 7 | 599 | 40 | 102 | — | 1,999 | −131 | 936 | 40 | 306 | — | 1,458 | −72 |
| 8 | 637 | 40 | 270 | — | 893 | −337 | 983 | 40 | 810 | — | 7 | −623 |
| 9 | 645 | — | — | — | 1,155 | −75 | 1,935 | — | — | — | −135 | −765 |
| 10 | 645 | — | — | — | 1,515 | −64 | 1,935 | — | — | — | 225 | −754 |
| 11 | 645 | — | — | — | 555 | −165 | 1,935 | — | — | — | −735 | −855 |
| 12 | 645 | — | — | — | 1,905 | −65 | 1,935 | — | — | — | 615 | −755 |
| 13 | 645 | — | — | — | 1,545 | −126 | 1,935 | — | — | — | 255 | −816 |
| 14 | 645 | — | — | — | 2,055 | −75 | 1,935 | — | — | — | 765 | −765 |
| 15 | 637 | 40 | 102 | — | 1,061 | −169 | 983 | 39 | 306 | — | 511 | −119 |

| | After 1,500 days | | | | | | |
|---|---|---|---|---|---|---|---|
| No. | $L_1$ (days) | $T_m$ (° C.) | $L_2$ (days) | $L_m$ (days) | L (days) | Deviation (days) | Measured value (days) |
| 1 | 1,144 | 41 | 547 | — | 109 | 79 | 1,530 |
| 2 | 1,144 | 41 | 547 | — | 469 | 90 | 1,879 |
| 3 | — | — | — | — | — | — | 1,020 |
| 4 | 1,144 | 41 | 547 | 1679 | −12 | −42 | 1,530 |
| 5 | 1,144 | 35 | 510 | — | 896 | 126 | 2,270 |
| 6 | 1,109 | 41 | 547 | — | 534 | 63 | 1,971 |
| 7 | 1,092 | 41 | 547 | — | 1,061 | 131 | 2,430 |
| 8 | 1,144 | 41 | 1,447 | — | −791 | −821 | 1,530 |
| 9 | 3,225 | — | — | — | −1,425 | −1,455 | 1,530 |
| 10 | 3,225 | — | — | — | −1,065 | −1,444 | 1,879 |
| 11 | — | — | — | — | — | — | 1,020 |
| 12 | 3,225 | — | — | — | −675 | −1,445 | 2,270 |
| 13 | 3,075 | — | — | — | −885 | −1,356 | 1,971 |
| 14 | 3,000 | — | — | — | −300 | −1,230 | 2,430 |
| 15 | 1,144 | 34 | 592 | — | 64 | 34 | 1,530 |

TABLE 3

| Elapsed time (days) | $T_m$ (° C.) | $L_2$ (days) |
|---|---|---|
| 300 | 40 | 102 |
| 600 | 41 | 211 |
| 900 | 39 | 306 |
| 1,200 | 51 | 525 |
| 1,500 | 34 | 592 |

From Table 2, it can be seen that the results of Comparative Examples 1 to 3 shown in rows No. 9 to No. 14 have significant deviations from the measured value, while the results of Examples 1 to 6 shown in rows No. 1 to No. 7 have small deviations from the measured value. This tendency becomes more profound with the elapsed time. This is probably because corrosion of the hydrogen-absorbing alloy is abated as the cycles are repeated, while it depends on the time elapsed after the nickel-hydrogen storage battery was installed with no relation to the number of discharge cycles, and therefore the equation of this embodiment gives a good approximation.

On the other hand, in Reference Example (No. 8) which did not take the elapsed time having no relation to the number of discharge cycles into account, significant deviation from the measured value was shown, although not so profound as in Comparative Examples 1 to 3. Particularly in this Example, since the battery is constituted so that capacity of the negative electrodes is twice that of the positive electrodes, it is supposed that the deteriorating rate of the battery life deviates significantly from the value of a linear function and becomes more proximate to the equation of this embodiment.

Higher accuracy is achieved as the elapsed time becomes longer with the results in Example 3 shown in row No. 4 than with the results in Examples 1 and 2 shown in rows No. 1 to No. 3. This is considered to be because it is easier to take into account the heat generated from the battery during charging and discharging and the change in the ambient temperature in Example 3 than in Examples 1 and 2.

Higher accuracy is achieved as the elapsed time becomes longer with the results in Example 6 shown in row No. 15 than with the results in Example 3 shown in row No. 4. This is considered to be because the accuracy of calculating the second diminution in lifetime $L_2$ has improved. While decrease in lifetime at a time when 1,200 days have elapsed is determined in No. 4 by calculating the mean value $T_m$ of the storage battery temperatures during the period of 1,200 days so as to calculate the second diminution in lifetime $L_2$, the second diminution in lifetime $L_2$ is calculated by calculating the mean value $T_m$ of the storage battery temperatures at intervals of 300 days in No. 15. Then the second diminution in lifetime $L_2$ is subtracted from the remaining lifetime value L every time, and therefore it is supposed that the accuracy of the remaining lifetime value L is improved. Thus it is assumed that the second diminution in lifetime $L_2$ can be calculated with higher accuracy in No. 15 than in No. 4, in consideration of the fact that the mean value $T_m$ of the storage battery temperatures measured at a time when 1,200 days have elapsed was 51° C. Also it is assumed that the second diminution in lifetime $L_2$ can be calculated with higher accuracy in No. 15 than in No. 4, in consideration of the fact that the mean value $T_m$ of the storage battery temperatures measured at a time when 1,500 days have elapsed was 34° C.

While the battery was housed in a can made of a metal having a relatively high heat dissipation property in Examples 1 to 6, it is supposed that the effect of estimation by the equations (4) and (5) becomes more conspicuous when an electrolyte cell made of a resin having a lower heat dissipation property is used.

While an intermittent battery charging operation based on a $-\Delta V$ control system was employed in Examples 1 to 6, a similar effect can be achieved also with an intermittent charging operation based on a dT/dt control system that is a temperature control system or timer control system, or with a trickle charging operation.

The embodiments described above are based on the invention having the constitution described below.

The battery life predicting device according to one aspect of the present invention comprises the lifetime data storing unit for storing lifetime data that shows the relationship between the load power applied by a storage battery during discharge and the ambient temperature of the location where the storage battery is installed, and the lifetime of the storage battery; the load power measuring unit for measuring the load power applied by the storage battery; the ambient temperature measuring unit for measuring the ambient temperature; the expected lifetime selecting unit for selecting, as an expected lifetime value, a lifetime that corresponds to the load power measured by the load power measuring unit and the ambient temperature measured by the ambient temperature measuring unit while referring to the lifetime data stored in the lifetime data storing unit; the discharge cycles counting unit for counting the number of discharge cycles of the storage battery; the first diminution in lifetime calculating unit for calculating the first diminution in lifetime which decreases the expected lifetime value based on a natural logarithmic function that takes the time converted from the number of discharge cycles counted by the discharge cycles counting unit as a variable; the mean value calculating unit for calculating the mean value of the storage battery temperatures during charging, discharging or an idle state; the elapsed time measuring unit for measuring the time elapsed after the installation of the storage battery, the second diminution in lifetime calculating unit for calculating a second diminution in lifetime which decreases the expected lifetime value based on the mean value of the storage battery temperatures calculated by the mean value calculating unit, the ambient temperature measured by the ambient temperature measuring unit and the time elapsed measured by the elapsed time measuring unit; and the remaining lifetime value calculating unit for calculating the remaining lifetime value by subtracting the first diminution in lifetime calculated by the first diminution in lifetime calculating unit and the second diminution in lifetime calculated by the second diminution in lifetime calculating unit from the expected lifetime value selected by the expected lifetime selecting unit.

The battery life predicting method according to another aspect of the present invention comprises the load power measuring step for measuring the load power applied by the storage battery during discharge; the ambient temperature measuring step for measuring the ambient temperature of the location where the storage battery is installed; the expected lifetime value selecting step for selecting, as the expected lifetime value, a lifetime that corresponds to the load power measured in the load power measuring step and the ambient temperature measured in the ambient temperature measuring step while referring to the lifetime data that shows the relationship between the load power applied by the storage battery and the ambient temperature of the location where the storage battery is installed, and the lifetime of the storage battery; the number of discharges counting step for counting the number of discharge cycles of the storage battery; the first diminution in lifetime calculating step for calculating the first diminution in lifetime which decreases the expected lifetime value based on a natural logarithmic function that takes a value of time, obtained by converting the number of discharge cycles counted by the discharge cycles counting unit, as a variable; the mean value counting step for calculating the mean value of the storage battery temperatures during charging, discharging or an idle state; the elapsed time measuring step for measuring the time elapsed after the installation of the storage battery; the second diminution in lifetime calculating step for calculating the second diminution in lifetime which decreases the expected lifetime value based on the mean value of the storage battery temperatures calculated in the mean value counting step, the ambient temperature measured in the ambient temperature measuring step and the time elapsed measured in the elapsed time measuring step; and the remaining lifetime value calculating step for calculating the remaining lifetime value by subtracting the first diminution in lifetime calculated in the first diminution in lifetime calculating step and the second diminution in lifetime calculated in the second diminution in lifetime calculating step from the expected lifetime value selected in the expected lifetime value selecting step.

In this constitution, lifetime data that shows the relationship between the load power applied by a storage battery during discharge and the ambient temperature of the location where the storage battery is installed, and the lifetime of the storage battery is stored in the lifetime data storing unit. With the load power applied by the storage battery and the ambient temperature measured, reference is made to the lifetime data stored in the lifetime data storing unit and a value of lifetime that corresponds to the measured values of the load power and the ambient temperature is selected as the expected lifetime value. With number of discharge cycles of the storage battery being counted, and the first diminution in lifetime which decreases the expected lifetime value being calculated based on a natural logarithmic function that takes a value of time, obtained by converting the number of discharge cycles of the storage battery, as a variable, the first diminution in lifetime that decreases the expected lifetime is calculated. Then the mean value of the storage battery temperatures during charging, discharging or an idle state is calculated. With the time elapsed after the installation of the storage battery being measured, the second diminution in lifetime which decreases the expected lifetime value is calculated based on the mean value of the storage battery temperatures, the ambient temperature measured and the time elapsed. Then the remaining lifetime value is calculated by subtracting the first diminution in lifetime and the second diminution in lifetime from the expected lifetime value.

Thus since the expected lifetime value is selected as the lifetime that corresponds to the load power and the ambient temperature, while the first diminution in lifetime calculated based on a natural logarithmic function that takes the time obtained by converting the number of discharge cycles as a variable and the second diminution in lifetime calculated from the mean value of the storage battery temperatures, the ambient temperature and the time elapsed are subtracted from the expected lifetime value, it is made possible to accurately determine the lifetime of the storage battery while taking into account the influences on the lifetime of the storage battery by the discharge made for backup during power failure, and factors that are not directly related to the number of discharge cycles such as the ambient temperature and the time elapsed after the installation of the storage battery.

It is preferable that, in the battery life predicting device described above, the second diminution in lifetime calculating unit calculates the second diminution in lifetime by multiplying the value of an exponential function that takes the difference between the mean value of the storage battery temperatures calculated by the mean value calculating unit and the ambient temperature measured by the ambient temperature measuring unit as a variable by the elapsed time measured by the elapsed time measuring unit.

With this constitution, since the second diminution in lifetime is calculated by multiplying the value of exponential function that takes the difference between the mean value of the storage battery temperatures calculated by the mean value calculating unit and the ambient temperature measured by the ambient temperature measuring unit as a variable by the elapsed time, it is made possible to calculate the second diminution in lifetime accurately.

It is also preferable that the battery life predicting device described above further comprises the occasional expected lifetime value calculating unit for calculating the occasional expected lifetime value by multiplying the value of an exponential function that takes the difference between the measured value of ambient temperatures and the mean value of temperatures of the storage battery as a variable by the initial value of the expected lifetime value, and the remaining lifetime value calculating unit calculates the remaining lifetime value by subtracting the first diminution in lifetime calculated by the first diminution in lifetime calculating unit and the second diminution in lifetime calculated by the second diminution in lifetime calculating unit from the occasional expected lifetime value calculated by the occasional expected lifetime value calculating unit.

With this constitution, the occasional expected lifetime value is calculated by multiplying the value of an exponential function that takes the difference between the measured value of ambient temperature and the mean value of temperatures of the storage battery as a variable by the selected value of the expected lifetime value, and the remaining lifetime value is calculated by subtracting the first diminution in lifetime and the second diminution in lifetime from the occasional expected lifetime value. Therefore, since the expected lifetime value is occasionally corrected and the remaining lifetime value is calculated by using the corrected value of the expected lifetime value (the occasional expected lifetime value), accuracy of the remaining lifetime value can be improved further.

It is also preferable that the battery life predicting device described above further comprises the lifetime value storing unit for storing the remaining lifetime value calculated by the remaining lifetime value calculating unit, and the remaining lifetime value calculating unit reads the remaining lifetime value calculated last from the lifetime value storing unit and subtracts the first diminution in lifetime and the second diminution in lifetime from the remaining lifetime value so as to calculate the latest value of the remaining lifetime value.

With this constitution, the remaining lifetime value that has been calculated is stored in the lifetime value storing unit, and the remaining lifetime value calculated last and stored in the lifetime value storing unit is read so as to calculate the latest value of the remaining lifetime value by subtracting the first diminution in lifetime and the second diminution in lifetime from the remaining lifetime value that has been read. Therefore, since the latest value of remaining lifetime value is calculated by subtracting the first diminution in lifetime and the second diminution in lifetime from the remaining lifetime value calculated last, the accuracy of calculating the remaining lifetime value can be improved, thereby making it possible to predict the lifetime of the storage battery more accurately.

In the battery life predicting device described above, the storage battery preferably includes a nickel-hydrogen storage battery. As noted previously, the lifetime of the nickel-hydrogen storage battery is mainly affected by the corrosion of the hydrogen-absorbing alloy used in the negative electrode. The hydrogen-absorbing alloy undergoes quick self-destruction due to volume changes as the hydrogen-absorbing alloy stores and releases hydrogen in the early charging and discharging cycles. While this process accelerates the corrosion of the hydrogen-absorbing alloy, the self-destruction subsides as the battery has repeated a certain number of discharges, so that corrosion is abated. In addition, a corrosive reaction proceeds as metal ions elute from the surface of the hydrogen-absorbing alloy with time elapsed after the nickel-hydrogen storage battery was installed, regardless of the number of discharge cycles. This corrosive reaction proceeds faster when the ambient temperature is higher. As a result, unlike the lead-acid battery in which charging and discharging are repeated as an active material dissolves and then precipitates, life shortening due to characteristic deterioration of the nickel-hydrogen storage battery is represented by correcting the decrease in the lifetime calculated from the number of discharge cycles by such factors as the ambient temperature and the elapsed time since the installation of the storage battery that are not directly related to the number of discharge cycles. Thus the lifetime can be predicted accurately based on the characteristics of the nickel-hydrogen storage battery.

In the battery life predicting device described above, it is preferable that the storage battery is provided integrally with various sections of the battery life predicting device. As the storage battery is provided integrally with various sections of the battery life predicting device, it becomes easier to handle and the length of wiring becomes shorter between the storage battery and the counting unit and the measuring unit of the battery life predicting device.

In the battery life predicting device described above, it is preferable to further provide a notifying unit for informing the user of the remaining lifetime value calculated by the remaining lifetime value calculating unit. With this constitution, since the user is informed of the remaining lifetime value that has been calculated, the user is capable of properly dealing with the storage battery that is near exhaustion based on the knowledge of the remaining lifetime value of the storage battery.

In the battery life predicting device described above, it is preferable to further provide a communication unit for sending the remaining lifetime value calculated by the remaining lifetime value calculating unit. With this constitution, since the remaining lifetime value that has been calculated is sent, a unit that receives the remaining lifetime value can act in accordance to the remaining lifetime value.

In the battery life predicting device described above, it is preferable to further provide a charge control unit for controlling charging of the storage battery based on the remaining lifetime value calculated by the remaining lifetime value calculating unit. With this constitution, since charging of the storage battery is controlled based on the remaining lifetime value that has been calculated, charging of the storage battery can be properly controlled based on the remaining lifetime value that has been calculated.

INDUSTRIAL APPLICABILITY

The battery life predicting device and the battery life predicting method according to the present invention are capable of accurately predicting the lifetime of a storage battery, and are useful as a battery life predicting device and a battery life predicting method for predicting the lifetime of a storage battery used in an uninterruptible power supply or the like.

The invention claimed is:

1. A battery life predicting device comprising:
a lifetime data storing unit for storing lifetime data that shows the relationship between the load power applied by a storage battery during discharge and the ambient temperature of the location where the storage battery is installed, and the lifetime of the storage battery;
a load power measuring unit for measuring the load power applied by the storage battery;
an ambient temperature measuring unit for measuring the ambient temperature;
an expected lifetime value selecting unit for selecting, as an expected lifetime value, a lifetime that corresponds to the load power measured by the load power measuring unit and the ambient temperature measured by the ambient temperature measuring unit while referring to the lifetime data stored in the lifetime data storing unit;
a discharge cycles counting unit for counting the number of discharge cycles of the storage battery;
a first diminution in lifetime calculating unit for calculating a first diminution in lifetime which decreases the expected lifetime value based on a natural logarithmic function that takes the time obtained by converting the number of discharge cycles counted by the discharge cycles counting unit as a variable;
a mean value calculating unit for calculating the mean value of the temperature of the storage battery during charging, discharging or an idle state;
an elapsed time measuring unit for measuring the time elapsed after the installation of the storage battery,
a second diminution in lifetime calculating unit for calculating a second diminution in lifetime which decreases the expected lifetime value based on the mean value of the temperatures of the storage battery calculated by the mean value calculating unit, the ambient temperature measured by the ambient temperature measuring unit and the time elapsed measured by the elapsed time measuring unit; and
a remaining lifetime value calculating unit for calculating the remaining lifetime value by subtracting the first diminution in lifetime calculated by the first diminution in lifetime calculating unit and the second diminution in lifetime calculated by the second diminution in lifetime calculating unit from the expected lifetime value selected by the expected lifetime selecting unit.

2. The battery life predicting device according to claim 1, wherein the second diminution in lifetime calculating unit calculates the second diminution in lifetime by multiplying the value of an exponential function that takes the difference between the mean value of the storage battery temperatures calculated by the mean value calculating unit and the ambient temperature measured by the ambient temperature measuring unit as a variable by the elapsed time measured by the elapsed time measuring unit.

3. The battery life predicting device according to claim 1, further comprising an occasional expected lifetime value calculating unit for calculating an occasional expected lifetime value by multiplying the value of an exponential function that takes the difference between the ambient temperature measured by the ambient temperature measuring unit and the mean value of temperatures of the storage battery calculated by the mean value calculating unit as a variable by the value of expected lifetime value selected by the expected lifetime selecting unit, wherein
the remaining lifetime value calculating unit calculates the remaining lifetime value by subtracting the first diminution in lifetime calculated by the first diminution in lifetime calculating unit and the second diminution in lifetime calculated by the second diminution in lifetime calculating unit from the occasional expected lifetime value calculated by the occasional expected lifetime value calculating unit.

4. The battery life predicting device according to claim 1, further comprising a lifetime value storing unit for storing the remaining lifetime value calculated by the remaining lifetime value calculating unit, wherein
the remaining lifetime value calculating unit reads the value of the remaining lifetime value that has been calculated last and stored in the lifetime data storing unit, and calculates the latest value of the remaining lifetime value by subtracting the first diminution in lifetime and the second diminution in lifetime from the remaining lifetime value that has been read.

5. The battery life predicting device according to claim 1, wherein the storage battery includes a nickel-hydrogen storage battery.

6. The battery life predicting device according to claim 1, wherein the storage battery is installed integrally with various units of the battery life predicting device.

7. The battery life predicting device according to claim 1, further comprising a notifying unit for informing the user of the remaining lifetime value calculated by the remaining lifetime value calculating unit.

8. The battery life predicting device according to claim 1, further comprising a communication unit for sending the remaining lifetime value calculated by the remaining lifetime value calculating unit.

9. The battery life predicting device according to claim 1, further comprising a charge control unit for controlling charging of the storage battery based on the remaining lifetime value calculated by the remaining lifetime value calculating unit.

10. A battery life predicting method comprising:
- a load power measuring step for measuring the load power applied by a storage battery during discharge;
- an ambient temperature measuring step for measuring the ambient temperature of the location where the storage battery is installed;
- an expected lifetime value selecting step for selecting, as an expected lifetime value, a lifetime that corresponds to the load power measured in the load power measuring step and the ambient temperature measured in the ambient temperature measuring step while referring to the lifetime data that shows the relationship between the load power applied by the storage battery during discharge and the ambient temperature of the storage battery, and the lifetime of the storage battery;
- a number of discharges counting step for counting the number of discharge cycles of the storage battery;
- a first diminution in lifetime calculating step for calculating the first diminution in lifetime which decreases the expected lifetime value based on a natural logarithmic function that takes a value of time, obtained by converting the number of discharge cycles counted in the discharge cycles counting step, as a variable;
- a mean value counting step for calculating the mean value of the temperatures of the storage battery during charging, discharging or an idle state;
- an elapsed time measuring step for measuring the time elapsed after the installation of the storage battery;
- a second diminution in lifetime calculating step for calculating the second diminution in lifetime which decreases the expected lifetime value based on the mean value of the storage battery temperatures calculated in the mean value counting step, the ambient temperature measured in the ambient temperature measuring step and the time elapsed measured in the elapsed time measuring step; and
- a remaining lifetime value calculating step for calculating the remaining lifetime value by subtracting the first diminution in lifetime calculated in the first diminution in lifetime calculating step and the second diminution in lifetime calculated in the second diminution in lifetime calculating step from the expected lifetime value selected in the expected lifetime value selecting step.

* * * * *